(12) United States Patent
Miyanaga et al.

(10) Patent No.: US 10,422,937 B2
(45) Date of Patent: Sep. 24, 2019

(54) WAVELENGTH CONVERTING MEMBER, AND LIGHT EMITTING DEVICE, LIGHT EMITTING ELEMENT, LIGHT SOURCE UNIT, AND DISPLAY DEVICE USING WAVELENGTH CONVERTING MEMBER

(71) Applicant: NS MATERIALS INC., Fukuoka (JP)

(72) Inventors: Akiharu Miyanaga, Fukuoka (JP); Shingo Kokudo, Fukuoka (JP); Eiichi Kanaumi, Fukuoka (JP); Tetsuji Ito, Fukuoka (JP); Yoshikazu Nageno, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 15/522,362

(22) PCT Filed: Oct. 27, 2015

(86) PCT No.: PCT/JP2015/080172
§ 371 (c)(1),
(2) Date: Apr. 27, 2017

(87) PCT Pub. No.: WO2016/072311
PCT Pub. Date: May 12, 2016

(65) Prior Publication Data
US 2017/0315288 A1     Nov. 2, 2017

(30) Foreign Application Priority Data
Nov. 4, 2014   (JP) .................................. 2014-224052

(51) Int. Cl.
*F21V 8/00*       (2006.01)
*H01L 33/50*      (2010.01)

(52) U.S. Cl.
CPC .......... *G02B 6/0026* (2013.01); *G02B 6/0088* (2013.01); *H01L 33/50* (2013.01); *H01L 33/505* (2013.01); *H01L 33/501* (2013.01)

(58) Field of Classification Search
CPC ..... G02B 6/0026; G02B 6/0088; H01L 33/50; H01L 33/505
See application file for complete search history.

(56) References Cited

U.S. PATENT DOCUMENTS

2013/0050616 A1*  2/2013 Seo ................... G02F 1/133603
                                                              349/71
2013/0294107 A1   11/2013 Ohkawa et al.
(Continued)

FOREIGN PATENT DOCUMENTS

CN    103681990 A    3/2014
JP    5-71855        9/1993
(Continued)

OTHER PUBLICATIONS

International Search Report, along with English-language translation thereof, issue in PCT/JP2015/080172 dated Dec. 22, 2015.
(Continued)

*Primary Examiner* — Anh T Mai
*Assistant Examiner* — Nathaniel J Lee
(74) *Attorney, Agent, or Firm* — Greenblum & Bernstein, P.L.C.

(57) ABSTRACT

To provide a wavelength converting member in which the occurrence of blackening can be suppressed compared to the prior art; and a light emitting device, a light emitting element, a light source unit, and a display device using the wavelength converting member. The wavelength converting member includes: a receptacle including a light entrance plane and a light exit plane opposite to the light entrance plane and provided with a receiving space inside the light
(Continued)

entrance plane and the light exit plane; and a wavelength conversion layer having quantum dots that is placed in the receiving space. The distance between the light entrance plane and the wavelength conversion layer is longer than the distance between the light exit plane and the wavelength conversion layer.

13 Claims, 12 Drawing Sheets

(56) References Cited

U.S. PATENT DOCUMENTS

| | | |
|---|---|---|
| 2014/0021503 A1 | 1/2014 | Yoshida et al. |
| 2014/0133159 A1* | 5/2014 | Asano .................. C03B 23/245 362/317 |
| 2014/0160790 A1* | 6/2014 | Park ....................... B82Y 20/00 362/608 |
| 2014/0185271 A1 | 7/2014 | Hyun |
| 2014/0240644 A1 | 8/2014 | Abe |
| 2015/0214445 A1 | 7/2015 | Qiu et al. |
| 2016/0102821 A1* | 4/2016 | Haitz ....................... F21V 7/04 362/84 |

FOREIGN PATENT DOCUMENTS

| | | | | |
|---|---|---|---|---|
| JP | 8-172033 | | 7/1996 | |
| JP | 08172033 A | * | 7/1996 | |
| JP | 08172033 A | * | 7/1996 | |
| JP | 9-271082 | | 10/1997 | |
| JP | 2009-71005 | | 4/2009 | |
| JP | 2013-16583 | | 1/2013 | |
| JP | 2013-68728 | | 4/2013 | |
| JP | 2013068728 A | * | 4/2013 | ........... G02B 6/0028 |
| JP | 2013068728 A | * | 4/2013 | ........... G02B 6/0028 |
| JP | 2013-115351 | | 6/2013 | |
| JP | 2013-218954 | | 10/2013 | |
| WO | 2012/132232 | | 10/2012 | |

OTHER PUBLICATIONS

Extended European search report issued for European Application No. 15856967.3 dated May 8, 2018.
F. Aloui et al., "Refractive index evolution of various commercial acrylic resins during photopolymerization", eXPRESS Polymer Letters, vol. 12, No. 11, pp. 966-971 (2018), available online at www.expresspolymlett.com; https://doi.org/10.3144/expresspolymlett.2018.83.
Eric Vanlathem et al., "Novel silicone materials for LED packaging and optoelectronics devices", Proc. SPIE 6192,Organic Optoelectronics and Photonics, 619202 (Apr. 20, 2006); doi: 10.1117/12.664918, Event: SPIE Photonics Europe, 2006, Strasbourg, France.

* cited by examiner

WAVELENGTH CONVERTING MEMBER, AND LIGHT EMITTING DEVICE, LIGHT EMITTING ELEMENT, LIGHT SOURCE UNIT, AND DISPLAY DEVICE USING WAVELENGTH CONVERTING MEMBER

TECHNICAL FIELD

The present invention relates to a wavelength converting member having a wavelength conversion layer in a receptacle, and a light emitting device, a light emitting element, a light source unit, and a display device using the wavelength converting member.

BACKGROUND ART

For example, JP 2013-218954 A (PTL 1) below discloses an invention relating to a light emitting device including a light source, a wavelength converting member, a light guide plate, and others.

The wavelength converting member is provided between the light source and the light guide plate, and absorbs light having a wavelength of light emitted from the light source and then produces light having a wavelength different therefrom. In the wavelength converting member; for example, a wavelength converting material is encapsulated in a cylindrical receptacle made of glass or the like. The wavelength converting material includes fluorescent pigment, fluorescent dye, quantum dots, or the like. PTL 1 also describes that quantum dots are preferred as the wavelength converting material (see paragraph [0018]). The wavelength converting material absorbs light from a light source, converts it into light having a different wavelength, and emits the converted light. The wavelength converting material is placed in the exact middle between a light entrance plane and a light exit plane of the receptacle as shown in FIG. 2, etc. of PTL 1. Further, as shown in FIG. 2, etc. of PTL 1, the wavelength converting member is placed adjacent to the light source.

CITATION LIST

Patent Literature

PTL 1: JP 2013-218954 A

SUMMARY OF INVENTION

Technical Problem

However, it has been found that in the structure of a conventional light emitting device including quantum dots in its wavelength conversion layer, blackening would occur in the wavelength conversion layer adjacent to a light source due to light or heat coming from the light source, or the like, which reduces the light emission efficiency of the light emitting device.

PTL 1 does not describe nor suggest any means to prevent the occurrence of blackening in the wavelength conversion layer.

The present invention was made in consideration of the above, in particular with a view to providing a wavelength converting member in which the occurrence of blackening can be suppressed compared to the prior art; and a light emitting device, a light emitting element, a light source unit, and a display device using the wavelength converting member.

Solution to Problem

The inventors of the present invention worked diligently on their studies and found that the occurrence of blackening can be suppressed by adjusting the position of the wavelength conversion layer containing quantum dots in a receptacle. Thus, they completed the present invention. The present invention includes the following features.

A wavelength converting member of the present invention includes: a receptacle including a light entrance plane and a light exit plane opposite to the light entrance plane and provided with a receiving space inside the light entrance plane and the light exit plane; and a wavelength conversion layer having quantum dots that is placed in the receiving space. A distance L1 between the light entrance plane and the wavelength conversion layer is longer than a distance L2 between the light exit plane and the wavelength conversion layer.

This allows the wavelength conversion layer to be kept at a suitable distance from a light source when the wavelength converting member is incorporated in a light emitting device or the like, so that the occurrence of blackening can be suppressed compared to the prior art.

In the present invention, the wavelength conversion layer is preferably formed from a resin composition in which the quantum dots are dispersed.

Further, in the present invention, colored layers are preferably formed on side surfaces connecting the light entrance plane and the light exit plane, on end portions of the light exit plane, or over the side surfaces and the end portions of the light exit plane. Thus colored layers thus provided allows the wavelength converting member to effectively convert the color of light having entered the light entrance plane and output the light from the light exit plane.

Alternatively, in the present invention, the receiving space may be provided inside the side surfaces connecting the light entrance plane and the light exit plane, and colored layers may be formed on wall surfaces defining the receiving space. Yet alternatively, the receiving space may be provided inside the side surfaces connecting the light entrance plane and the light exit plane, and colored layers are respectively provided between the side surfaces of the receptacle and the receiving space.

In the present invention, the colored layers are preferably colored in white. Further, in the present invention, the colored layers are preferably made of paint, ink, or tape. Preferably, in the present invention, a distinguishing portion for distinguishing the light entrance plane side and the light exit plane side is provided.

A light emitting device of the present invention is configured to have a light emitting element and any one of the above wavelength converting members placed on the light emission side of the light emitting element. In a structure of the light emitting device of the present invention, the light emitting element and the wavelength converting member may be placed in contact with each other, which allows the wavelength converting member to be easily placed while keeping the wavelength conversion layer at a suitable distance from the light emitting element.

A light emitting element of the present invention is configured to have a light emitting chip and any one of the wavelength converting members placed on the light output side of the light emitting chip. In a structure of the light emitting element of the present invention, a resin layer covering the light emitting chip and the wavelength converting member may be placed in contact with each other, which allows the wavelength converting member to be easily placed while keeping the wavelength conversion layer at a suitable distance from the light emitting chip.

A light source unit of the present invention includes: the above described light emitting device or the above described light emitting element; and a light guide plate.

A display device of the present invention includes: a display area; and either the above described light emitting device or the above described light emitting element, which is placed on the back side of the display area.

The above described light emitting device, light emitting element, light source unit, and display device of the present invention are each provided with a wavelength converting member of the present invention. Therefore, the occurrence of blackening can be suitably suppressed compared to the prior art, leading to improved light emission efficiency.

Advantageous Effects of Invention

The occurrence of blackening can be suppressed compared to the prior art by incorporating a wavelength converting member of the present invention into a light emitting device or the like. Thus, the light emission efficiency of the light emitting device, light emitting element, light source unit, and display device including a wavelength converting member of the present invention can be improved compared to the prior art.

BRIEF DESCRIPTION OF DRAWINGS

In the accompanying drawings.

DESCRIPTION OF EMBODIMENTS

Embodiments of the present invention (hereinafter simply referred to as "embodiments") will now be described in detail. The present invention is not limited to the following embodiments and can be variously altered without departing from the spirit of the present invention.

Figure 1:
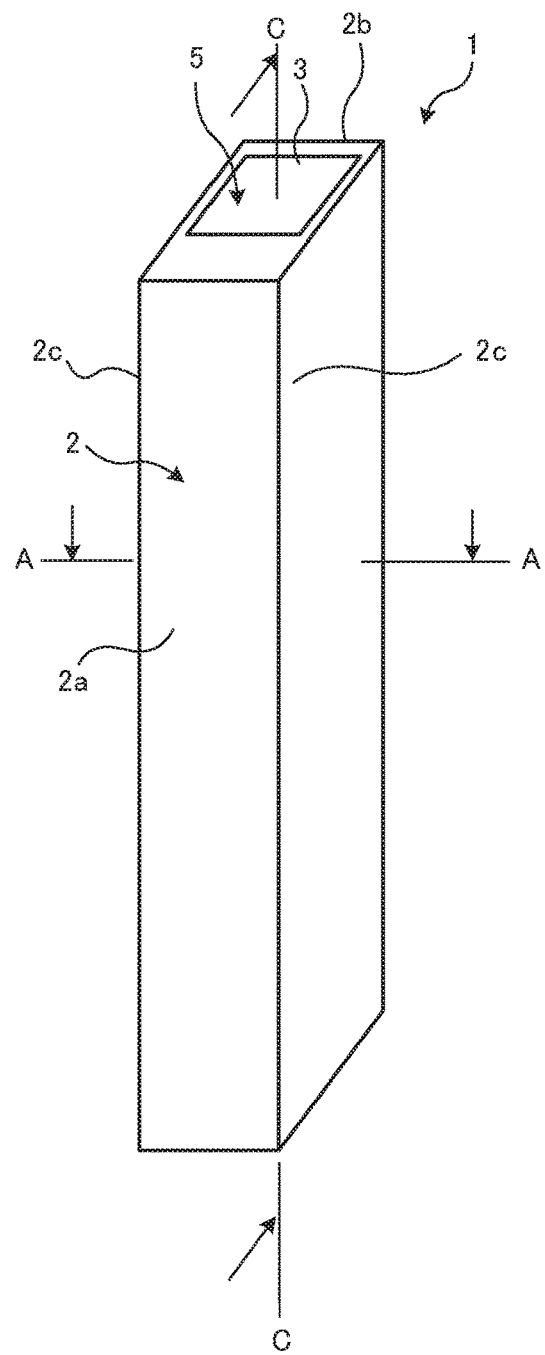
FIG. 1 is a perspective view of a wavelength converting member exemplifying a first embodiment of the present invention.
Figure 2:
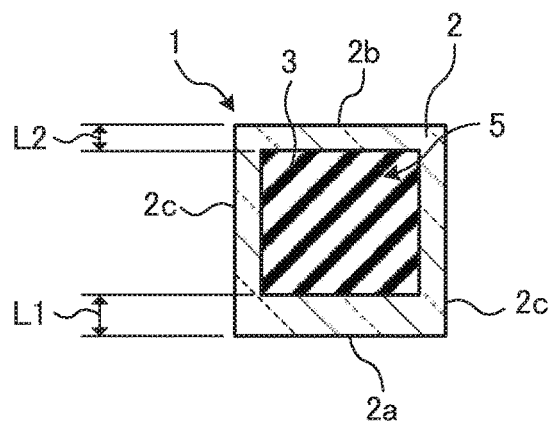
FIG. 2 is a cross-sectional view of the wavelength converting member shown in FIG. 1, taken perpendicular to the wavelength converting member along line A-A and viewed in the direction of the arrows.

FIG. 1 is a perspective view of a wavelength converting member exemplifying a first embodiment of the present invention. FIG. 2 is a cross-sectional view of the wavelength converting member shown in FIG. 1, taken perpendicular to the wavelength converting member along line A-A and viewed in the direction of the arrows.

As shown in FIG. 1 and FIG. 2, a wavelength converting member 1 of the first embodiment is configured to have a receptacle 2 and a wavelength conversion layer 3.

The receptacle 2 can receive and hold the wavelength conversion layer 3. The receptacle 2 is preferably a transparent member. The term "Transparent" herein refers to being commonly recognized as transparent or having a visible light transmittance of approximately 50% or more.

As shown in FIG. 1 and FIG. 2, the receptacle 2 includes a light entrance plane 2a, a light exit plane 2b, and side surfaces 2c connecting the light entrance plane 2a and the light exit plane 2b. As shown in FIG. 1 and FIG. 2, the light entrance plane 2a and the light exit plane 2b are positioned to face each other.

As shown in FIG. 1 and FIG. 2, in the receptacle 2, a receiving space 5 is formed inside the light entrance plane 2a, the light exit plane 2b, and the side surfaces 2c. The receiving space 5 may only be positioned inside at least the light entrance plane 2a and the light exit plane 2b. In other words, part of the receiving space 5 may reach the side surfaces 2c.

A wavelength conversion layer 3 is placed in the receiving space 5. As shown in FIG. 1, the receiving space 5 is open. For example, a wavelength converting material for forming the wavelength conversion layer 3 can be introduced through the opening to fill the receiving space 5. Alternatively, a molding of the wavelength conversion layer 3 may be inserted into the receiving space 5.

For example, the length and width of the receptacle 2 are approximately several millimeters to several tens of millimeters, whereas the length and width of the receiving space 5 are approximately several hundreds of micrometers to several millimeters.

As shown in FIG. 2, in the cross section taken along a plane perpendicular to at least one of the light entrance plane 2a and the light exit plane 2b, both the outline of the receiving space 5 and the outline of the receptacle 2 have a rectangular shape. Here, the "rectangular shape" includes squares and oblongs with approximately right angles at the four vertices.

As shown in FIG. 2, the cross-sectional contour of the receiving space 5 and the cross-sectional contour of the receptacle 2 are preferably similar to each other.

The receptacle 2 shown in FIG. 1 and FIG. 2 is, for example, a glass tube receptacle, and a glass capillary can be given as an example. Alternatively, the receptacle may be made of a resin or the like as long as the receptacle can be configured to have transparency, gas barrier properties, and water resistance.

The wavelength conversion layer 3 shown in FIG. 1 and FIG. 2 preferably contains a material which absorbs blue light and emits red light, and a wavelength converting material which absorbs blue light and emits green light. Specifically, the wavelength conversion layer 3 contains at least quantum dots. Although the structure and the material of the quantum dots are not limited; for example, a quantum dot in this embodiment can have a core consisting of a semiconductor particle and a shell part coating the circumference of the core. A material that is used for the core is, for example, but not limited to CdSe. For example, a core material containing at least Zn and Cd; a core material containing Zn, Cd, Se, and S; ZnCuInS; CdS; CdSe; ZnS; ZnSe; InP; CdTe; or a composite thereof can be used. A quantum dot of this embodiment may be configured to have only a core part consisting of a semiconductor particle without the formation of a shell part. Accordingly, the quantum dot does not necessarily have a coating structure using a shell part as long as they have at least a core part. For example, when a core part is coated with a shell part, there are cases where the coating structure cannot be analyzed or observed because the area of the coating structure is too small or the coating part is too thin. Therefore, a quantum dot can be identified regardless of whether or not the presence of a shell part is determined by analysis.

The quantum dots include, for example, two types of quantum dots having an absorption (excitation) wavelength of 460 nm (blue): those which have a fluorescence wavelength of approximately 520 nm (green) and those which have a fluorescence wavelength of approximately 660 nm (red). Accordingly, when blue light enters the light entrance plane 2a, each quantum dot converts part of the blue light into green or red light. Thus, white light can be obtained from the light exit plane 2b.

The wavelength conversion layer 3 may contain quantum dots and another fluorescent material other than quantum dots. Examples include: red light emitting quantum dots and a green light emitting fluorescent material; and green light emitting quantum dots and a red light emitting fluorescent material. Examples of fluorescent materials include, but are not limited to, YAG (yttrium aluminum garnet) based, TAG (terbium aluminum garnet) based, SiAlON, and BOS (barium orthosilicate) based phosphors.

The quantum dots contained in the wavelength conversion layer 3 may be distributed uniformly throughout the wavelength conversion layer 3; alternatively, the quantum dot content on the light entrance plane 2a side may be different from that on the light exit plane 2b side. When the content varies, the quantum dots contained on the light entrance plane 2a side are preferably less than the quantum dots contained on the light exit plane 2b side. Yet alternatively, the wavelength conversion layer 3 may have a resin layer containing no quantum dots on the light entrance plane 2a side and have a resin layer containing quantum dots only on the light exit plane 2b side.

The wavelength conversion layer 3 is preferably formed from a resin composition in which quantum dots are dispersed. Examples of resins that can be used include: polypropylene, polyethylene, polystyrene, AS resin, ABS resin, methacrylate resin, polyvinyl chloride, polyacetal, polyamide, polycarbonate, modified polyphenylene ether, polybutylene terephthalate, polyethylene terephthalate, polysulfone, polyethersulfone, polyphenylene sulfide, polyamideimide, polymethylpentene, liquid crystal polymers, epoxy resin, phenol resin, urea formaldehyde resin, melamine resin, diallyl phthalate resin, unsaturated polyester resin, polyimide, polyurethane, silicone resin, and mixtures thereof. Of those, a silicone resin or an epoxy resin is preferably used to form a resin composition in which the quantum dots are dispersed. More preferably, a silicone resin is used to form a resin composition in which the quantum dots are dispersed.

Further, the refractive index of the resin forming the wavelength conversion layer 3 is preferably lower than the refractive index of the receptacle 2. The refractive index of the sodium D line through a silicone resin at 23° C. is for example, 1.52 for SCR1016 manufactured by Shin-Etsu Chemical Co., Ltd.; 1.55 for A2045 manufactured by Daicel Corporation; 1.41 for KER-2500 manufactured by Shin-Etsu Chemical Co., Ltd.; and 1.41 for A1080 manufactured by Daicel Corporation. Meanwhile, the refractive index of the sodium D line through an epoxy resin at 23° C. is 1.51 and 1.50 for CELVENUS WO917 and CELVENUS WO925 both manufactured by Daicel Corporation, respectively. On the other hand, the receptacle 2 made of glass has a refractive index of nearly 1.45 when made of typical glass, and approximately 1.50 to 1.90 when made of highly refractive optical glass. Accordingly, when the resin forming the wavelength conversion layer 3 and the material of the receptacle 2 are suitably selected, the refractive index of the resin forming the wavelength conversion layer 3 can be made lower than the refractive index of the receptacle 2. For example, a silicone resin A1080 or KER-2500 having a refractive index of 1.41 can be used as a resin forming the wavelength conversion layer 3, whereas the receptacle 2 can be made of glass having a refractive index of 1.45. In another example, a silicone resin or an epoxy resin having a refractive index of 1.41 to 1.55 can be used as a resin forming the wavelength conversion layer 3 and the receptacle 2 can be made of glass having a high refractive index of 1.56 or more. This causes part of light having entered the wavelength conversion layer 3 to be totally reflected at side wall portions of the receptacle 2 facing the receiving space 5, because the angle of incidence is larger on the low refractive index medium side than on the angle of incidence on the high refractive index medium side. Thus, the amount of light leaking from the sides of the receptacle 2 can be reduced, thereby increasing color conversion efficiency and light emission intensity.

As shown in FIG. 2, the distance between the light entrance plane 2a and the wavelength conversion layer 3 is L1, whereas the distance between the light exit plane 2b and the wavelength conversion layer 3 is L2. The distances L1 and L2 are straight-line distances. For example, a straight line is drawn between the centers of the light entrance plane 2a and the light exit plane 2b, and the distances L1 and L2 can be measured as lengths along the straight line.

As shown in FIG. 2, in this embodiment, the distance L1 is longer than the distance L2. In other words, the wall of the receptacle 2 is thicker on the light entrance plane 2a side than on the light exit plane 2b side when viewed from the wavelength conversion layer 3.

For example, the distance L1 is, but not limited to, approximately 1 mm to 8 mm, whereas the distance L2 is, but not limited to, approximately 0.2 mm to 1 mm. By way of example, the distance L1 is approximately 5 mm, and the distance L2 is approximately 0.5 mm.

Figure 9:
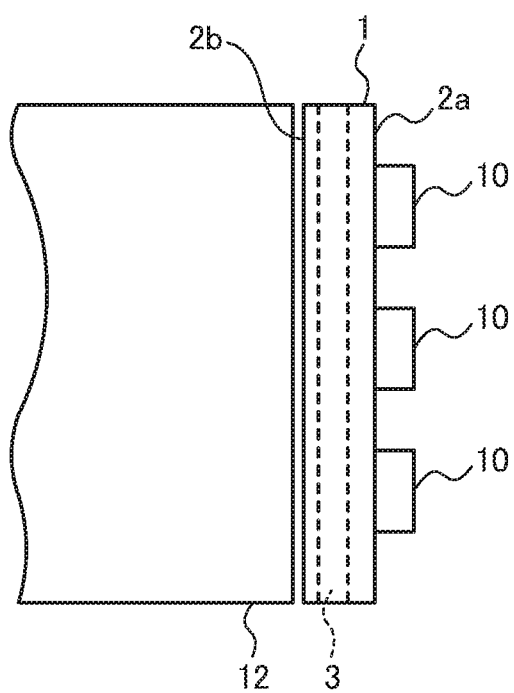
FIG. 9 is a plan view of a light emitting device and a light source unit using the wavelength converting member shown in FIG. 1.

The wavelength converting member 1 shown in FIG. 1 and FIG. 2 can be provided between light emitting elements (light source) 10, for example, LEDs and a light guide plate 12 as shown in FIG. 9. Here, the wavelength converting member 1 and the light emitting elements 10 are assembled to form a light emitting device, and the light guide plate 12 is added to the light emitting device to form a light source unit. Meanwhile, the wavelength converting member 1 and the light guide plate 12 can be assembled to form a light guide member. The light emitting device shown in FIG. 9 can be used, for example, as a white surface light source of a liquid crystal display.

As shown in FIG. 9, the wavelength converting member 1 is placed in contact with the light emitting elements 10. On this occasion, the light emitting elements 10 abut the light entrance plane 2a of the wavelength converting member 1. Further, the wavelength converting member 1 may be in contact with the light guide plate 12. In this embodiment, the wavelength conversion layer 3 formed in the wavelength converting member 1 is placed closer to the light entrance plane 2a than to the light exit plane 2b.

In the prior art, a wavelength conversion layer is placed in the middle between the light entrance plane and the light exit plane of a wavelength converting member. Namely, the distances of the light entrance plane and the light exit plane from the wavelength conversion layer are equal. In contrast, in this embodiment, the wavelength conversion layer 3 is placed closer to the light entrance plane 2a than to the light exit plane 2b. Accordingly, when the wavelength converting member 1 is incorporated into a light emitting device, the wavelength conversion layer 3 can be more suitably and easily kept at a distance from the light emitting elements 10 in this embodiment compared to the prior art. In particular, as in this embodiment, the wavelength converting member 1 is placed in contact with the light emitting elements 10, so that the wavelength conversion layer 3 can easily and suitably be incorporated into the light emitting device with the wavelength conversion layer 3 being kept at a distance from the light emitting elements 10. In addition, placing the wavelength converting member 1 in contact with the light emitting elements 10 allows the light emitting device to be thinner.

It has been found that when the wavelength conversion layer is adjacent to the light emitting elements 10 as in the conventional structure, blackening occurs in part of the wavelength conversion layer facing the light emitting elements 10. The blackening seems to occur because light or heat or both from the light emitting elements 10 affect the quantum dots.

To address this problem, in this embodiment, the distance L1 between the wavelength conversion layer 3 and the light entrance plane 2a is made longer than the distance L2 between the wavelength conversion layer 3 and the light exit plane 2b to keep the wavelength conversion layer 3 at a distance from the light emitting elements 10 thereby suppressing the occurrence of blackening. This allows the wavelength conversion layer 3 to be suitably kept at a distance from the light emitting elements 10 even without placing the wavelength converting member in the device differently from the prior art and even when the wavelength converting member 1 is placed in contact with the light emitting elements 10 as shown in FIG. 9. Thus, the occurrence of blackening can be suppressed compared to the prior art.

In this embodiment, the wall of the receptacle 2 is thinner on the light exit plane 2b side when viewed from the wavelength conversion layer 3. This can suppress the occurrence of blackening while preventing the increase in the general thickness of the whole receptacle 2 (the width between the light entrance plane 2a and the light exit plane 2b).

Figure 3:
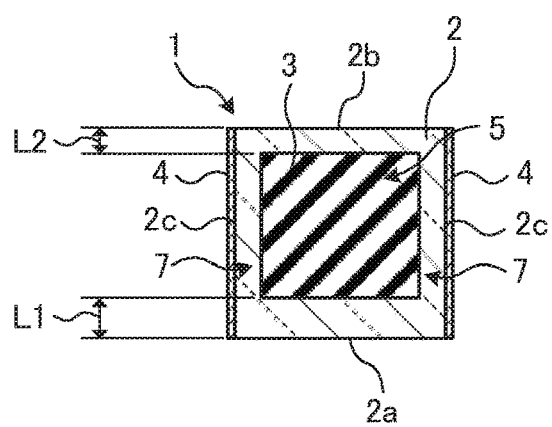
FIG. 3 is a cross-sectional view of a wavelength converting member having a cross-sectional shape different from the one in FIG. 2.

FIG. 3 is a cross-sectional view of a wavelength converting member having a cross-sectional shape different from the one in FIG. 2. In FIG. 2 and FIG. 3, same reference numerals indicate like parts.

In FIG. 3, the side surfaces 2c of the receptacle 2 are provided with colored layers 4, 4. The term "colored layer" refers to a non-transparent layer that is colored in any color including white. The colored layers 4 are preferably made of paint, ink, or tape. The color of the colored layers 4 is preferably, but not limited to, white. Accordingly, the color layers 4 can simply be formed by coating the side surfaces 2c with white paint or white ink or by sticking white tape to the side surfaces 2c. Alternatively, a metal such as Ni, Ag, Al, or Cr can be vapor deposited to form the colored layers 4.

This can prevent light leak, where light exits through side areas 7, compared to the prior art, enable suitable and efficient color conversion, and provide light having a desired color (e.g., white light) from the light exit plane 2b.

Figure 4A:
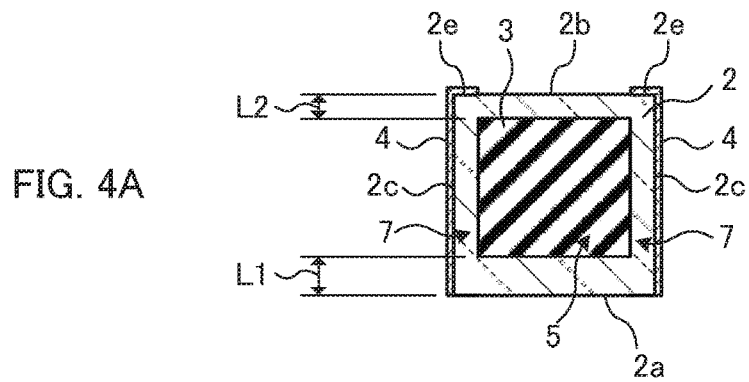
FIGS. 4A to 4D are cross-sectional views each showing a wavelength converting member having a cross-sectional shape different from the one in FIGS. 2 and 3.
Figure 4B:
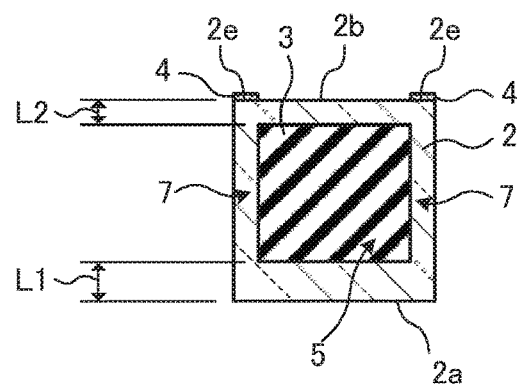

In FIG. 3, the colored layers 4 are formed on the side surfaces 2c of the receptacle 2; alternatively, as shown in FIG. 4A, the colored layers 4 can be formed over the side surfaces 2c of the receptacle 2 and end portions 2e of the light exit plane 2b. Yet alternatively, as shown in FIG. 4B, the colored layers 4 can be formed only on the end portions 2e of the light exit plane 2b. Note that the colored layers 4 are preferably formed on the side surfaces 2c of the receptacle 2 as shown in FIG. 3 or over the side surfaces 2c of the receptacle 2 and the end portions 2e of the light exit plane 2b as shown in FIG. 4A.

The end portions 2e of the light exit plane 2b face the side areas 7 between the receiving space 5 and the side surfaces 2c. Accordingly, the end portions 2e do not face the receiving space 5 filled with the wavelength conversion layer 3. It is preferable that the colored layers 4 provided on the end portions 2e of the light exit plane 2b are located on each side of the receiving space 5 filled with the wavelength conversion layer 3 and do not face the receiving space 5; however, the colored layers 4 can be formed to somewhat extend on the light exit plane 2b and partly face the receiving space 5. For example, it is acceptable if the colored layers 4 face approximately ⅓ or less of the width of the receiving space 5.

The colored layers 4 are preferably, but not necessarily, formed all over the side surfaces 2c or the end portions 2e, and the colored layers 4 may be formed on part of the side surfaces 2c or the end portions 2e. Note that, the colored layers 4 preferably cover 50% or more of the area of the side surfaces 2c or the end portions 2e. Instead of forming the colored layers 4 on the side areas 7, the whole or part of the side areas 7 can be formed from a colored material. For example, the whole or part of the side areas 7 can be formed from white glass or white resin.

Figure 4C:
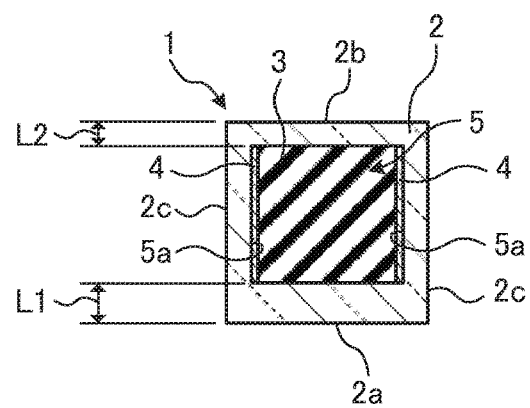

In the above example, the colored layers 4 are formed on the external surfaces of the receptacle 2; alternatively, the colored layers 4 can be formed on wall surfaces 5a defining the receiving space 5 as shown in FIG. 4C. The wall surfaces 5a forming the colored layers 4 are positioned to face the side surfaces 2c of the receptacle 2.

Figure 4D:
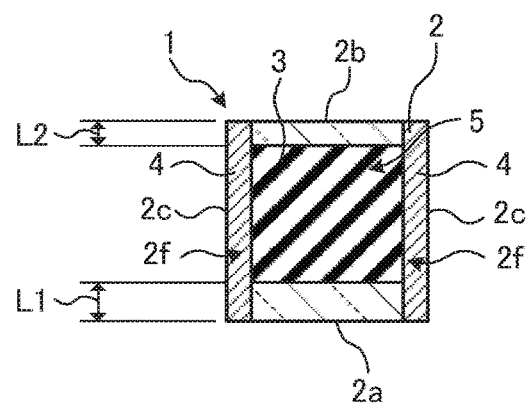

Alternatively, as shown in FIG. 4D, side portions 2f of the receptacle 2 between the side surfaces 2c of the receptacle 2 and the receiving space 5 themselves can serve as the colored layers 4. In that case, the receptacle 2 is formed by double injection molding, in which case, a colored resin is used for parts to be the side portions 2f of the receptacle 2. Alternatively, the side portions 2f of the receptacle 2 can be joined to the other components, for example, by bonding to obtain the receptacle 2 shown in FIG. 4D. Here, in FIG. 4C and FIG. 4D, the same reference numerals as in FIG. 4A and FIG. 4B indicate like parts in FIG. 4C and FIG. 4D.

Figure 5:
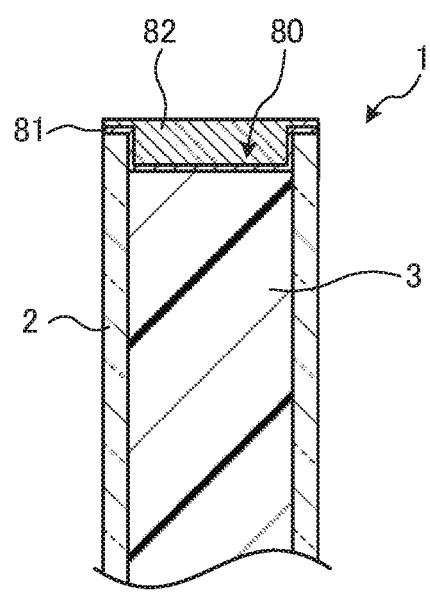
FIG. 5 is a cross-sectional view of the wavelength converting member shown in FIG. 1, taken perpendicular to the wavelength converting member along line C-C and viewed in the direction of the arrows.

FIG. 5 is a cross-sectional view of the wavelength converting member 1 shown in FIG. 1, taken along line C-C and viewed in the direction of the arrows. As shown in FIG. 5, stepped portions 80 are formed at either side of the wavelength converting member 1, such that the wavelength conversion layer 3 recedes from the receptacle 2. A chip 82 serving as a colored layer covering the stepped portions 80 is connected to the wavelength conversion layer 3 with an adhesive layer 81 provided therebetween. The chip 82 is formed into an approximately inverted shape of the stepped portions 80, such that part of the chip 82 facing the wavelength conversion layer 3 protrudes. The chip 82 is made of, for example, Al; however, the material is not specifically limited. The adhesive layer 81 preferably has water barrier properties. Note that the colored layer may be formed over both ends of the wavelength converting member 1 without the formation of the stepped portions 80. This can suppress light leak from the ends of the wavelength converting member 1, leading to suitable and highly efficient color conversion compared to the prior art.

Also in FIG. 3 and FIGS. 4A to 4D, the distance L1 between the light entrance plane 2a and the wavelength conversion layer 3 is longer than the distance L2 between the light exit plane 2b and the wavelength conversion layer 3.

Figure 6A:
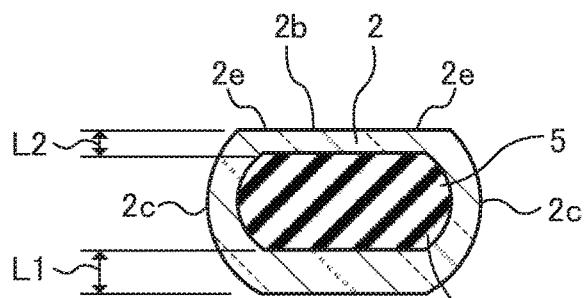
FIGS. 6A to 6D are cross-sectional views of wavelength converting members having a cross-sectional shape different from the one in FIGS. 2, 3, and 4A to 4D.

As shown in FIGS. 2 to 4D, the outer shape of the cross-sectional shape of the receptacle 2 and the receiving space 5 is preferably rectangular. Note, however, that the side surfaces 2c of the receptacle 2 and the side wall surfaces of the receiving space 5 may have curved surfaces or constitute part of an oval-like shape as shown in FIG. 6A.

Figure 6B:
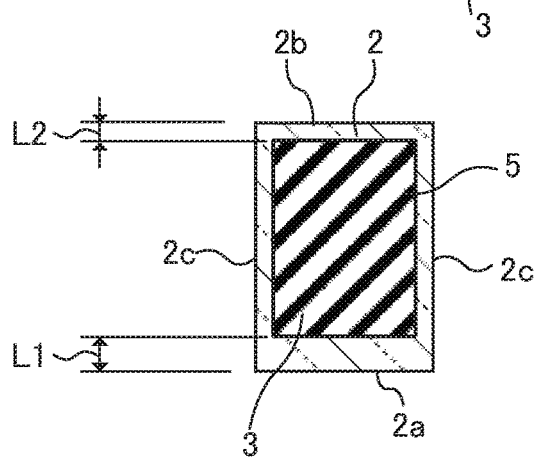

In FIGS. 2 to 4D, the outer shape of the receptacle 2 and the receiving space 5 is square; alternatively, the outer shape of the receptacle 2 and the receiving space 5 can be oblong as shown in FIG. 6B.

It should be noted that the distance L1 between the light entrance plane 2a and the wavelength conversion layer 3 can be more suitably and easily made longer than the distance L2 between the light exit plane 2b and the wavelength conversion layer 3 when the cross-sectional shapes are rectangular as shown in FIGS. 2 to 4D and FIG. 6B than when the cross-sectional shapes have curved lines. In addition, the colored layers 4 can be more easily formed in the former case.

Figure 6C:
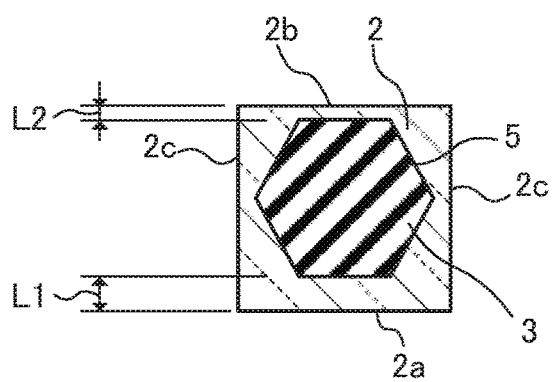

The outlines of the cross sections of the receptacle 2 and the receiving space 5 are preferably similar to each other; however, the outline of the cross section of the receptacle 2 may be different from the outline of the cross section of the receiving space 5 as shown in FIG. 6C. For example, in FIG. 6C, the outline of the cross section of the receptacle 2 is rectangular, whereas the outline of the cross section of the receiving space 5 is hexagonal.

Figure 6D:
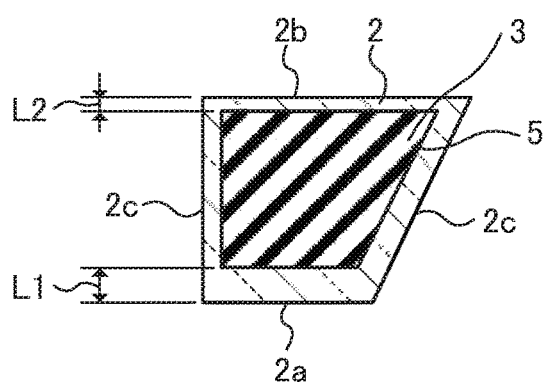

As shown in FIG. 6D, the outlines of the cross sections of the receptacle 2 and the receiving space 5 can have trapezoidal shapes similar to each other. For example, in FIG. 6D, the short side of the trapezoid corresponds to the light entrance plane 2a, and the long side thereof corresponds to the light exit plane 2b. This structure makes it possible to expand light emitted from a light source to a predetermined degree. In another example, in contrast to FIG. 6D, the long side of the trapezoid may correspond to the light entrance plane 2a, and the short side thereof may correspond to the light exit plane 2b. This structure makes it possible to focus light emitted from a light source to a predetermined degree. Alternatively, in the outlines of the cross sections of the receptacle 2 and the receiving space 5, the sides of the trapezoid are mutually line symmetric with respect to a center line passing through the centers of the upper base and the lower base of the trapezoid, unlike in FIG. 6D.

In each of FIGS. 6A to 6D, the distance L1 between the light entrance plane 2a and the wavelength conversion layer 3 is longer than the distance L2 between the light exit plane 2b and the wavelength conversion layer 3. Further, in each of the structures shown in FIGS. 6A to 6D, the colored layers 4 shown in FIG. 3 and FIGS. 4A to 4D can be provided.

The light entrance plane and the light exit plane are formed to be flat in each of FIGS. 2 to 6D; alternatively, either or both of the light entrance plane and the light exit plane may be formed to be curved. The side surfaces of the receptacle 2 are formed to be flat in each of FIG. 2 to FIG. 4D and FIGS. 6B to 6D; alternatively, the side surfaces may be formed to be curved. Further, the angles between the sides may be rounded. Specifically, expressions such as rectangular shapes, hexagonal shapes, and trapezoidal shapes are not limited to geometrically precise rectangles, hexagons, and trapezoids; and lines and angles forming those shapes may have distortions or deviations. Thus, the direction of the emission of light can be adjusted.

Figure 7:
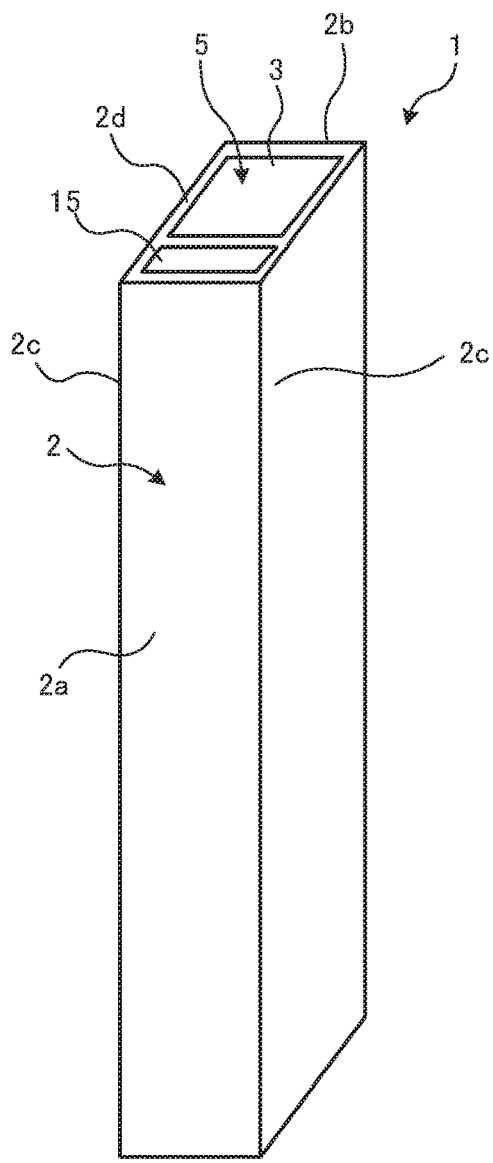
FIG. 7 is a perspective view of the wavelength converting member shown in FIG. 1, provided with a distinguishing portion.
Figure 8:
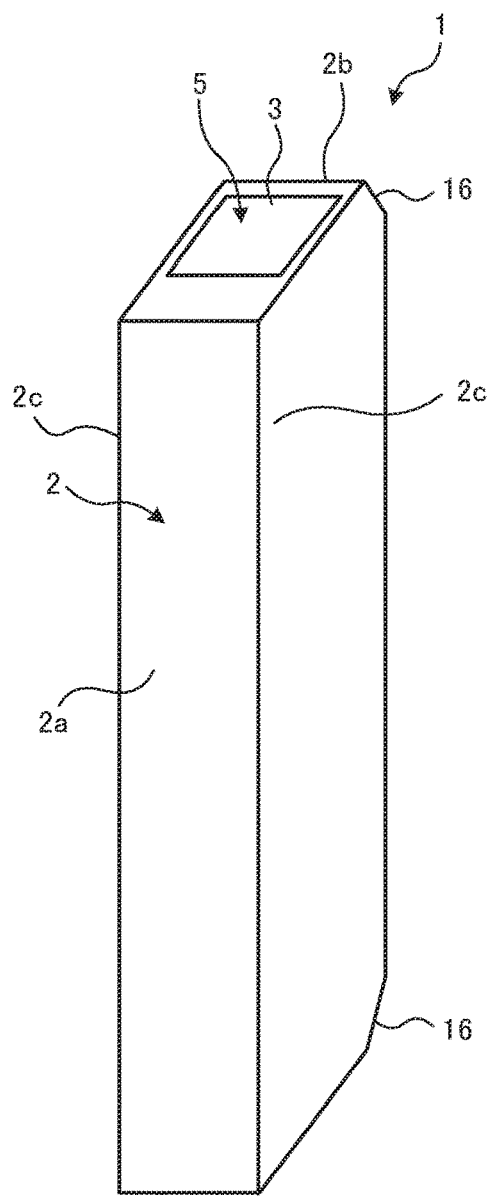
FIG. 8 is a perspective view of a wavelength converting member provided with distinguishing portions different from the one in FIG. 7.

FIG. 7 is a perspective view of the wavelength converting member shown in FIG. 1, provided with a distinguishing portion. FIG. 8 is a perspective view of a wavelength converting member provided with distinguishing portions different from FIG. 7.

As shown in FIG. 7, for example, a transverse plane 2d of the wavelength converting member 1 is provided with a distinguishing portion (marker) 15 for distinguishing the light entrance plane 2a side and the light exit plane 2b side. Here, the transverse plane is a plane that connects the light entrance plane 2a and the light exit plane 2 and includes an aperture of the receiving space 5.

The distinguishing portion 15 shown in FIG. 7 is a portion colored, for example, using paint, ink, tape, or the like. In FIG. 7, the distinguishing portion 15 is provided in an area between the receiving space 5 and the light entrance plane 2a. As seen, the distinguishing portion 15 is provided on the light entrance plane 2a side in in FIG. 7; however, it may alternatively be provided on the light exit plane 2b side. Yet alternatively, the distinguishing portion 15 may be provided in the side surfaces 2c instead of in the transverse plane 2d. With the colored distinguishing portion 15, it is possible to easily and suitably recognize visually which surface is the light entrance plane 2a or the light exit plane 2b.

In this embodiment, the light entrance plane 2a side is thicker (farther) than the light exit plane 2b side when viewed from the wavelength conversion layer 3. Accordingly, when the wavelength converting member 1 of this embodiment is placed between the light guide plate 12 and the light emitting elements 10 shown in FIG. 9, the orientation of the wavelength converting member 1 is considered important. Here, as in FIG. 7, the distinguishing portion 15 is provided to distinguish the light entrance plane 2a side and the light exit plane 2b side, thereby easily and suitably controlling the orientation of the wavelength converting member 1 to be placed so that the light entrance plane 2a faces the light emitting elements 10 and the light exit plane 2b faces the light guide plate 12.

In FIG. 8, unlike in FIG. 7, distinguishing portions 16 are provided such that the shape of the light exit plane 2b is different from that of the light entrance plane 2a. In FIG. 8, the edges on the light exit plane 2b side may be cut out to provide the distinguishing portions 16; alternatively, the distinguishing portion 16 may be provided on the light entrance plane 2a side. The distinguishing portions 16 are provided such that the shape of the light entrance plane 2a is different from that of the light exit plane 2b, making it possible to easily and suitably recognize tactually or visually which surface is the light entrance plane 2a or the light exit plane 2b. To provide the light entrance plane 2a and the light exit plane 2b with different shapes, instead of cutouts, protrusions or recesses may be provided on one of the light entrance plane 2a side and the light exit plane 2b side.

However, the structure of a distinguishing portion is not limited to that shown in FIG. 7 or FIG. 8. For example, when the wavelength converting member 1 is assembled under control of an assembling apparatus, humans are not required to distinguish the planes using a distinguishing portion as long as the assembling apparatus can distinguish the planes using the distinguishing portion.

Figure 10:
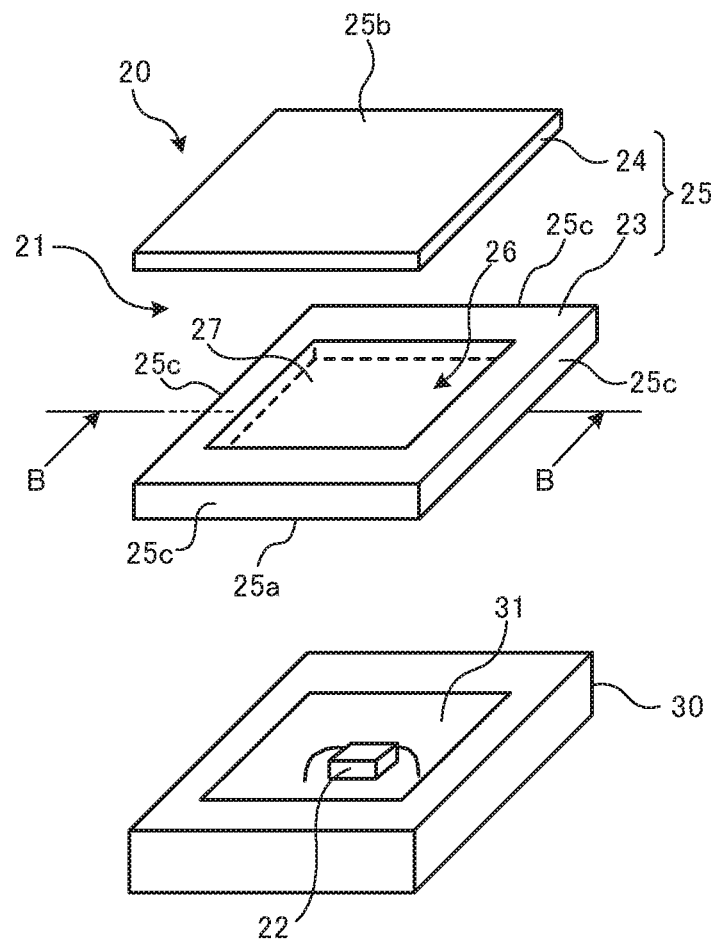
FIG. 10 is an exploded perspective view of a light emitting element exemplifying a second embodiment of the present invention, provided with a wavelength converting member.
Figure 11:
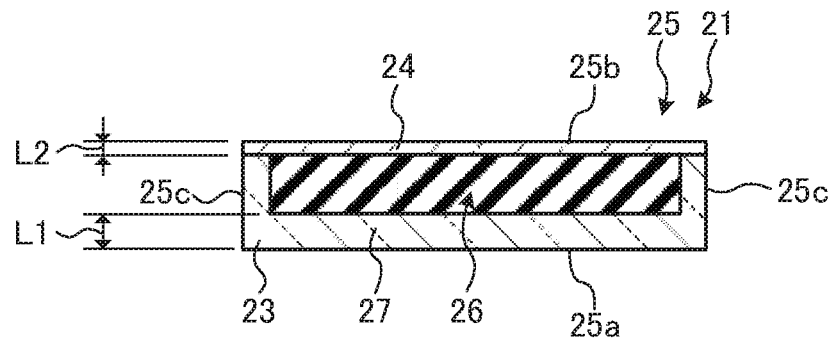
FIG. 11 is an enlarged longitudinal sectional view of the assembled wavelength converting members shown in FIG. 10, taken along line B-B in the height direction and viewed in the direction of the arrows.
Figure 12:
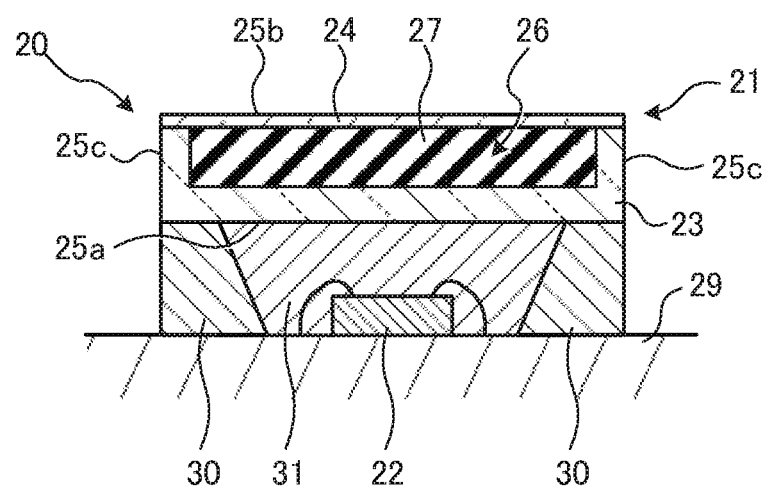
FIG. 12 is a longitudinal sectional view of the light emitting element shown in FIG. 10 with the members of the light emitting element shown in FIG. 10 having been assembled, taken along line B-B in the height direction and viewed in the direction of the arrows.

FIG. 10 is an exploded perspective view of a light emitting element exemplifying a second embodiment of the present invention, provided with a wavelength converting member. FIG. 11 is an enlarged longitudinal sectional view of the assembled wavelength converting member shown in FIG. 10, taken along line B-B in the height direction and viewed in the direction of the arrows. FIG. 12 is a longitudinal sectional view of the light emitting element shown in FIG. 10 with the members of the light emitting element shown in FIG. 10 having been assembled, taken along line B-B in the height direction and viewed in the direction of the arrows.

A light emitting element 20 shown in FIG. 10 and FIG. 12 is configured to have a wavelength converting member 21 and an LED chip (light emitting chip) 22. The wavelength converting member 21 includes a receptacle 25 composed of more than one component, that is, a receptacle body 23 and a cover 24. As shown in FIG. 10, FIG. 11, and FIG. 12, a receiving space 26 is formed in the center of the bottomed receptacle body 23. A wavelength conversion layer 27 is formed in the receiving space 26. The cover 24 is joined to the top of the receptacle body 23 with an adhesive layer provided therebetween.

The lower surface of the receptacle 25 is a light entrance plane 25a of the wavelength converting member 21 shown in FIG. 10, FIG. 11, and FIG. 12. The upper surface opposite to the light entrance plane 25a is a light exit plane 25b. The receiving space 26 is formed to be positioned inside both side surfaces 25c provided in the receptacle 25 of the wavelength converting member 21 shown in FIG. 10, FIG. 11, and FIG. 12.

As shown in FIG. 12, the LED chip 22 is connected to a printed wiring board 29 and the LED chip 22 is surrounded by a frame body 30 as shown in FIG. 10 and FIG. 12. The frame body 30 is filled with a resin layer 31.

As shown in FIG. 12, the wavelength converting member 21 is joined to the top of the frame body 30 with an adhesive layer, not shown, provided therebetween to form a light emitting element 20, for example, an LED.

As shown in FIG. 11, the receiving space 26 is provided inside the light entrance plane 25a and the light exit plane 25b. As shown in FIG. 11, the distance L1 between the light entrance plane 25a and the wavelength conversion layer 27 is longer than the distance L2 between the light exit plane 25b and the wavelength conversion layer 27. This makes it possible to keep the wavelength conversion layer 27 at a distance from the LED chip 22; consequently, quantum dots contained in the wavelength conversion layer 27 can be prevented from being affected by light or heat or both from the LED chip 22, and the occurrence of blackening can be suppressed.

As shown in FIG. 12, the wavelength converting member 21 is placed in contact with the resin layer 31 in which the LED chip 22 is encapsulated. In this embodiment, the distance L1 between the light entrance plane 25a and the wavelength conversion layer 27 is longer than the distance L2 between the light exit plane 25b and the wavelength conversion layer 27. Accordingly, the wavelength conversion layer 27 containing quantum dots can be suitably kept at a distance from the LED chip 22 without, for example, providing a space between the wavelength converting member 21 and the resin layer 31, so that the wavelength converting member 21 can be placed easily and suitably. Further, the wavelength converting member 21 is thinner on the light exit plane 25b when viewed from the wavelength conversion layer 27, thus preventing increased thickness of the wavelength converting member 21. Thus, placing the wavelength converting member 21 of this embodiment in contact with the resin layer 31 results in the realization of the light emitting element 20 having a similar thickness to or a smaller thickness than the conventional ones, in which the occurrence of blackening is suppressed.

In FIG. 11 and FIG. 12, like in FIG. 3 and FIGS. 4A to 4D, the colored layers 4 may be formed on the side surfaces 25c connecting the light entrance plane 25a and the light exit plane 25b, on end portions of the light exit plane 25b, or over the side surfaces 25c and the end portions of the light exit plane 25b. Alternatively, the colored layers 4 may be formed on the side walls defining the receiving space 5 or may be provided between the side walls defining the receiving space 5 and the side surfaces 25c. This can prevent light leak, where light exits through side areas of the wavelength converting member 21, compared to the prior art, enable suitable and efficient color conversion, and provide light having a desired color (e.g., white light) from the light exit plane 25b.

In FIG. 11 and FIG. 12, like in FIG. 7 and FIG. 8, distinguishing portions for distinguishing the light entrance plane 25a side and the light exit plane 25b side can be provided. The distinguishing portions can be formed in a similar manner to FIG. 7 and FIG. 8 or may be formed differently from FIG. 7 and FIG. 8. With the above structure, the wavelength converting member 21 can be placed to face the LED chip 22 without orienting the light entrance plane 25a side and the light exit plane 25b side of the wavelength converting member 21 in the wrong directions.

Figure 13:
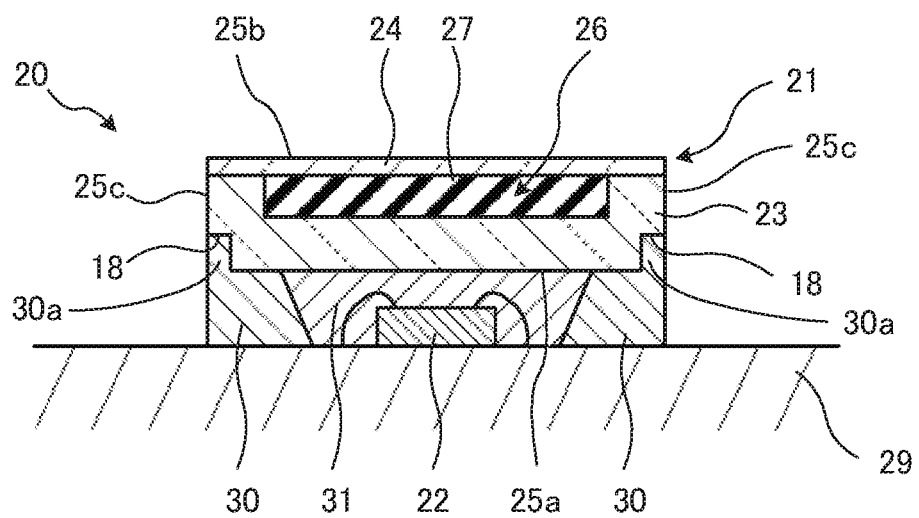
FIG. 13 is a longitudinal sectional view of a light emitting element, showing an example of providing distinguishing portions in a wavelength converting member exemplifying the second embodiment.

FIG. 13 is a longitudinal sectional view of a light emitting element, showing an example of providing distinguishing portions in a wavelength converting member exemplifying the second embodiment. In FIG. 13, distinguishing portions 18 constituted by stepped portions having a recessed shape are provided in edge portions of the wavelength converting member on the light entrance plane 25a side. Meanwhile, raised parts 30a are provided on the edge portions of the frame body 30 that houses the LED chip 22 so as to face the stepped portions having a recessed shape constituting the distinguishing portions 18. When the wavelength converting member 21 is placed over the frame body 30, the raised parts 30a provided on the frame body 30 are fit in the distinguishing portions 18 (stepped portions having a recessed shape)

provided on the wavelength converting member 21 with the distinguishing portions 18 facing downward. Alternatively, the distinguishing portions 18 can be placed as recessed parts inside the edge portions, and the wavelength converting member 21 can be fixed over the frame body 30 by fitting the raised parts 30a into the recessed parts (groove-ridge fitting). This makes it possible to adjust the up/down orientation and the lateral position of the wavelength converting member 21 at the same time, and to align the wavelength converting member 21 with the frame body 30 with high precision.

Figure 14:
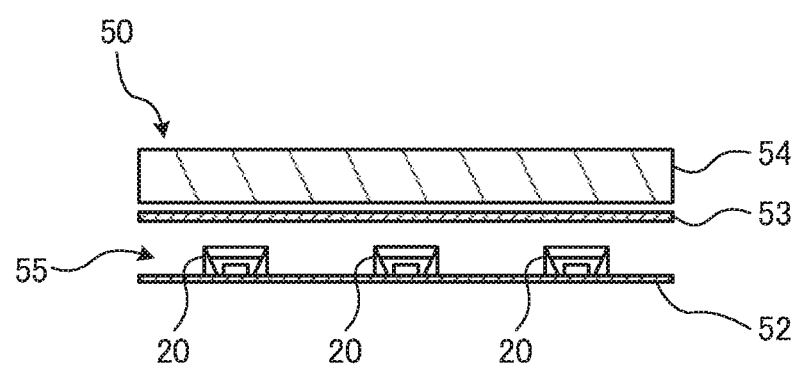
FIG. 14 is a longitudinal sectional view of a display device using the light emitting element shown in FIG. 10.

FIG. 14 is a longitudinal sectional view of a display device using light emitting elements shown in FIG. 10. As shown in FIG. 14, the display device 50 is configured to have a plurality of light emitting elements 20 (LEDs) and a display area 54 such as a liquid crystal display facing the light emitting elements 20. The light emitting elements 20 are placed on the back side of the display area 54.

The plurality of light emitting elements 20 are supported by a support body 52. The light emitting elements 20 are arranged at predetermined intervals. The light emitting elements 20 and the support body 52 constitute a back light 55 for the display area 54. The shape and the material of the support body 52 are not limited, and the support body 52 can be shaped, for example, like a sheet, a plate, or a case.

As shown in FIG. 14, a light diffusion plate 53, etc. are provided between the back light 55 and the display area 54.

A light source unit can be obtained by assembling the light emitting elements 20 shown in FIG. 10 and FIG. 12 and the light guide plate 12 shown in FIG. 9. Alternatively, the light emitting device (including the light emitting elements, the capillary wavelength converting member 1, the light guide plate 12, etc.) shown in FIG. 9 may be placed on the back side of the display area 54 shown in FIG. 14 (the light diffusion plate 53 and others can be optionally provided therebetween) to form the display device 50.

The wavelength converting member and the light emitting element of this embodiment can also be applied to other embodiments of a light source unit, a lighting system, a light diffusion apparatus, a light reflector system, and the like other than the light source unit or the display device described above.

INDUSTRIAL APPLICABILITY

In the present invention, LEDs, back light units, display devices, and the like can be realized using a wavelength converting member in which a wavelength conversion layer is formed in a receptacle. The wavelength converting member of the present invention makes possible to suppress the occurrence of blackening, and improve the light emission efficiency of LEDs, back light units, and display devices, and the like using the wavelength converting member of the present invention.

This application is based on Japanese patent application No. 2014-224052 filed on Nov. 4, 2014, the content of which is hereby incorporated in its entirety.

The invention claimed is:

1. A wavelength converting member comprising:
a receptacle including a light entrance surface and a light exit surface opposite to the light entrance surface, wherein the receptacle is provided with a receiving space at an inner side from each of the light entrance surface and the light exit surface;
a wavelength conversion layer having quantum dots that is placed in the receiving space,
  wherein a distance L1 between the light entrance surface and the wavelength conversion layer is longer than a distance L2 between the light exit surface and the wavelength conversion layer, and
  wherein a refractive index of a dispersion resin, for dispersing the quantum dots, that forms the wavelength conversion layer is in a range of 1.41 through 1.55, and a refractive index of the receptacle is in a range of 1.45 through 1.90; and
a colored distinguishing portion distinguishing the light entrance surface from the light exit surface, wherein said distinguishing portion is provided in an area between said light entrance surface and said receiving space.

2. The wavelength converting member according to claim 1, wherein colored layers are formed on side surfaces connecting the light entrance surface and the light exit surface, on end portions of the light exit surface, or over the side surfaces and the end portions of the light exit surface.

3. The wavelength converting member according to claim 2, wherein the colored layers are colored in white.

4. The wavelength converting member according to claim 2, wherein the colored layers are made of paint, ink, or tape.

5. The wavelength converting member according to claim 1, wherein the receiving space is provided at an inner side from each of the side surfaces connecting the light entrance surface and the light exit surface, and
colored layers are formed on wall surfaces defining the receiving space.

6. The wavelength converting member according to claim 1, wherein the receiving space is provided at an inner side from each of side surfaces connecting the light entrance surface and the light exit surface, and
colored layers are respectively provided between the side surfaces of the receptacle and the receiving space.

7. The wavelength converting member according to claim 1, further comprising a distinguishing portion for distinguishing the light entrance surface side and the light exit surface side.

8. A light emitting device configured to have a light emitting element and the wavelength converting member according to claim 1 placed on the light emission side of the light emitting element.

9. The light emitting device according to claim 8, wherein the light emitting element and the wavelength converting member are placed in contact with each other.

10. A light source unit comprising:
either the light emitting device according to claim 8; and
a light guide plate.

11. A display device comprising:
a display area; and
the light emitting device according to claim 8, which is placed on the back side of the display area.

12. A light emitting element configured to have a light emitting chip and the wavelength converting member according to claim 1 placed on the light output side of the light emitting chip.

13. The light emitting element according to claim 12, wherein a resin layer covering the light emitting chip and the wavelength converting member are placed in contact with each other.

* * * * *